(12) United States Patent
DelRossi et al.

(10) Patent No.: US 6,677,860 B2
(45) Date of Patent: Jan. 13, 2004

(54) METHOD AND APPARATUS FOR END OF DISCHARGE INDICATION BASED ON CRITICAL ENERGY REQUIREMENT

(75) Inventors: Richard J. DelRossi, Dallas, TX (US); Gary V. Zanders, Fairview, TX (US); Mark P. Enochson, Plano, TX (US); Jimmie C. Vernon, Carrollton, TX (US)

(73) Assignee: Microchip Technology Incorporated, Chandler, AR (US)

( * ) Notice: Subject to any disclaimer, the term of this patent is extended or adjusted under 35 U.S.C. 154(b) by 0 days.

(21) Appl. No.: 10/024,871

(22) Filed: Dec. 19, 2001

(65) Prior Publication Data

US 2003/0076231 A1 Apr. 24, 2003

Related U.S. Application Data

(60) Provisional application No. 60/335,218, filed on Oct. 19, 2001.

(51) Int. Cl.[7] .............................................. G08B 21/00
(52) U.S. Cl. .............................. 340/636.1; 340/636.11; 340/636.15; 320/43; 320/132
(58) Field of Search ..................... 340/636.1, 636.11, 340/636.15; 320/43, 132

(56) References Cited

U.S. PATENT DOCUMENTS

| | | | |
|---|---|---|---|
| 5,032,825 A | | 7/1991 | Kuznicki .................. 340/636 |
| 5,455,499 A | * | 10/1995 | Uskali et al. ................. 320/43 |
| 5,680,050 A | * | 10/1997 | Kawai et al. ................ 324/427 |
| 6,087,808 A | * | 7/2000 | Pritchard .................... 320/132 |
| 6,433,513 B1 | * | 8/2002 | Hayashi ...................... 320/132 |

OTHER PUBLICATIONS

International Search Report PCT/US02/17548, mailed Dec. 16, 2002.

* cited by examiner

Primary Examiner—Julie Lieu
(74) Attorney, Agent, or Firm—Baker Botts L.L.P.

(57) ABSTRACT

A battery monitoring system and method in accordance with the principles of the present invention, a capacity of interest is determined. This capacity of interest is the useful battery capacity required for an operation of interest; that is, the battery capacity at the discharge rate required for the operation of interest. The operation of interest may be a save-to-disk operation during a battery operated computer shutdown or a shutdown procedure for a personal digital assistant, for example. Given the capacity of interest, alarm settings are determined for a variety of voltage, discharge, and, optionally, temperature conditions. The trip points map, or index, voltage and discharge rate information for one or more discharge rates to one or more capacities of interest. When an indexed battery-voltage/discharge-rate combination that corresponds to the capacity of interest is encountered, an alarm may be set to indicate that, although the present voltage and discharge rates may indicate that there is more or less capacity than required for the critical operation, the capacity of interest (useful energy left at the discharge rate of interest) has been encountered.

22 Claims, 5 Drawing Sheets

|  | <-10° | <0° | <10° | <20° | <30° | <40° | <50° | >50° |
|---|---|---|---|---|---|---|---|---|
| <0.2C | V1 | V2 | V3 | | | | | |
| <0.5C | | | | ... | | | | |
| <0.8C | | | | | | | | |
| <1.1C | | | | | | | | |
| <1.4C | | | | | | | | |
| <1.7C | | | | | | | | |
| <2.0C | | | | | | | | |
| >2.0C | | | | | ... | V62 | V63 | V64 |

FIGURE 3

METHOD AND APPARATUS FOR END OF DISCHARGE INDICATION BASED ON CRITICAL ENERGY REQUIREMENT

RELATED APPLICATION

This application claims the benefit of the U.S. Provisional Application Ser. No. 60/335,218, filed Oct. 19, 2001, , entitled END OF DISCHARGE INDICATOR BASED ON PC SAVE-TO-DISK REQUIREMENT, invented by Richard J. DelRossi, Gary V. Zanders, Mark P. Enochson, and Jimmie C. Vernon, which application is hereby incorporated by reference in its entirety.

FIELD OF THE INVENTION

The invention relates to battery-power control and, more particularly, to low battery indicators.

BACKGROUND OF THE INVENTION

Battery-operated devices, such as notebook computers and personal digital assistants, for example, typically monitor some indication of remaining battery capacity in order to ensure that enough capacity remains to perform critical operations. For example, a battery-operated computer may need to perform an orderly shutdown, which may include relatively power-hungry operations such as a "save-to-disk", before the available battery capacity is depleted.

Battery voltage may be used to develop a warning signal that indicates that battery capacity has reached a level that only allows for the safe execution of one last critical task, such as a computer shutdown operation.

However, voltage alone provides an inadequate measure of remaining useful battery capacity (i.e., remaining energy available at a useful voltage, typically stated in milliamp-hours). For example, battery discharge rates can affect a battery's apparent remaining useful capacity. At a low discharge rate D1, the battery's voltage may indicate that a capacity Q1 remains, the voltage at a moderate discharge rate D2 may indicate that a different capacity Q2 remains, and the voltage at a high discharge rate D3 may indicate that a third capacity Q3 remains. If a battery-operated device's critical operation requires, for example, a capacity Q2 at discharge rate D2, a voltage measurement at a discharge rate of D1 may indicate that the battery's remaining capacity meets or exceeds the critical capacity/discharge rate Q2/D2 requirement, when, in fact, it doesn't. Similarly, given a critical capacity/discharge rate Q2/D2, a voltage measurement at a higher discharge rate D3 may indicate that the critical capacity/rate Q2/D2 has been reached before, indeed, it has.

Due to the effect that different discharge rates have on a battery's useful energy capacity, battery-operated system designers typically "over-engineer" the system to ensure that there is sufficient remaining useful battery capacity to allow a critical operation, such as a shut-down operation, to be performed before the useful battery capacity is "exhausted." This sort of "worst-case" design effectively limits the useful capacity of a system to that associated with worst-case battery drain.

A system and method for monitoring and reporting battery capacity that permits the full usage of a battery's capacity would therefore be highly desirable.

SUMMARY

In a battery monitoring system and method in accordance with the principles of the present invention, a capacity of interest is determined. This capacity of interest is the useful battery capacity required for an operation of interest; that is, the battery capacity at the discharge rate required for the operation of interest. The operation of interest may be a save-to-disk operation during a battery operated computer shutdown, a shutdown procedure for a personal digital assistant, or the sounding of a low-battery alarm for a cellular telephone, for example. Given the capacity of interest, alarm settings (also referred to herein as indices or flags) are determined for a variety of voltage and discharge conditions. The indices map voltage and discharge rate information for one or more discharge rates to the capacity of interest.

When an indexed battery-voltage/discharge-rate combination that corresponds to the capacity of interest is encountered, an alarm may be activated to indicate that, although the present voltage and discharge rates may indicate that there is more or less capacity than required for the operation of interest, the capacity of interest (useful energy left at the discharge rate of interest) has been reached.

A battery monitoring system and method in accordance with the principles of the present invention may also include a temperature sensor that permits the trip points to be adjusted for variations in the temperature of a battery being monitored. The monitoring system will be particularly useful in battery charging systems, battery-powered electronic devices, such as computers (laptop, notebook, handheld, etc.), personal digital assistants, pagers, and cellular telephones, for example.

BRIEF DESCRIPTION OF THE DRAWINGS

The above and further features, aspects, and advantages of the invention will be apparent to those skilled in the art from the following detailed description, taken together with the accompanying drawings in which:

FIG. 3 is a tabular representation of a temperature-compensation scheme whereby temperature-related effects on battery capacity are accommodated in accordance with the principles of the present invention;

DETAILED DESCRIPTION

Figure 1:
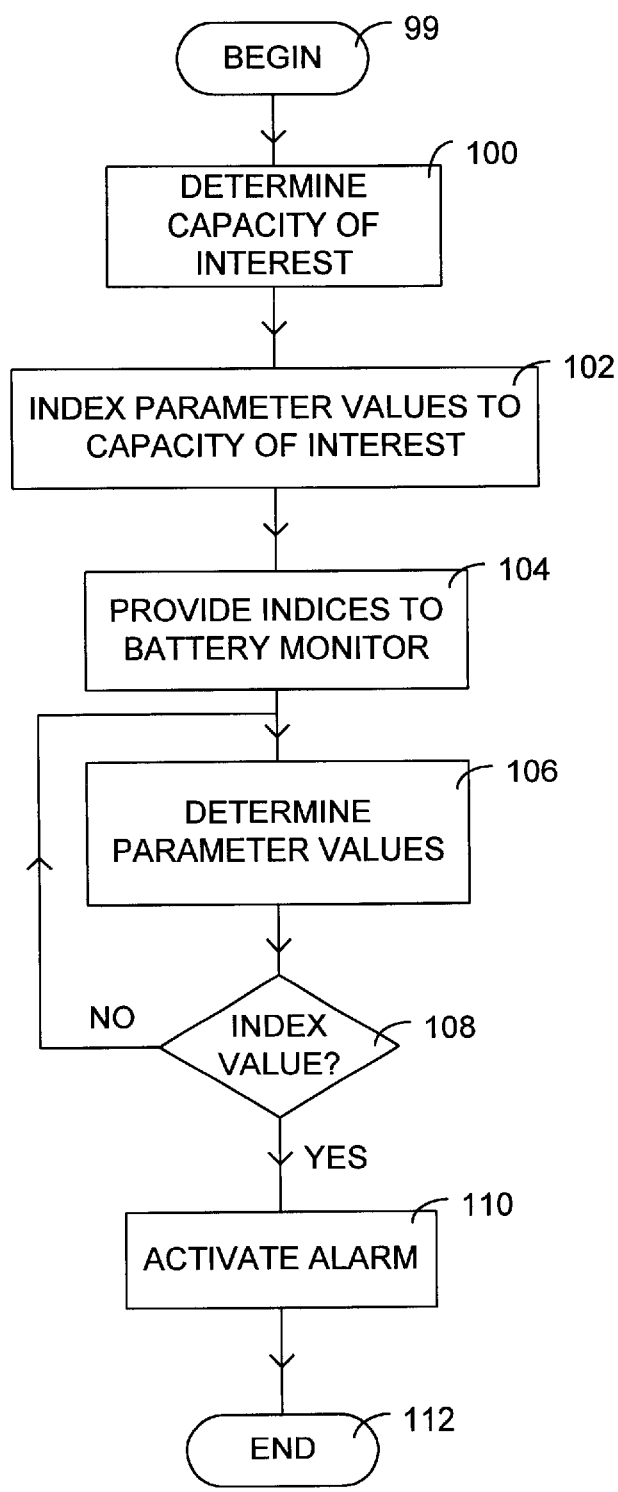
FIG. 1 is a flowchart depicting the process of monitoring battery capacity in accordance with the principles of the present invention.

A method for monitoring a battery's operation in accordance with the principles of the present invention is set forth in the flow chart of FIG. 1. The embodiment described in the discussion related to FIG. 1 may be employed for a single battery or battery type and may be repeated for a variety of battery types that may be monitored in accordance with the principles of the present invention. The process begins in step 99 and proceeds to step 100 where one or more battery capacities of interest are determined. Each such capacity of interest is the useful battery capacity required for an operation of interest: that is, the battery capacity at the discharge rate required for the operation of interest. The operation of interest may be a save-to-disk operation during a battery operated computer shutdown, a shutdown procedure for a personal digital assistant, or the sounding of a low-battery alarm for a cellular telephone, for example. Such capacities may be determined by a computer manufacturer, who determines a capacity of interest for a shutdown operation that includes a save-to-disk operation, for example. The manufacturer may include additional alarms for display to an end user. For example, alarms may be used to indicate to an end user that the computer's battery is not sufficiently charged to play a digital versatile disk (DVD) in its entirety.

Figure 2:
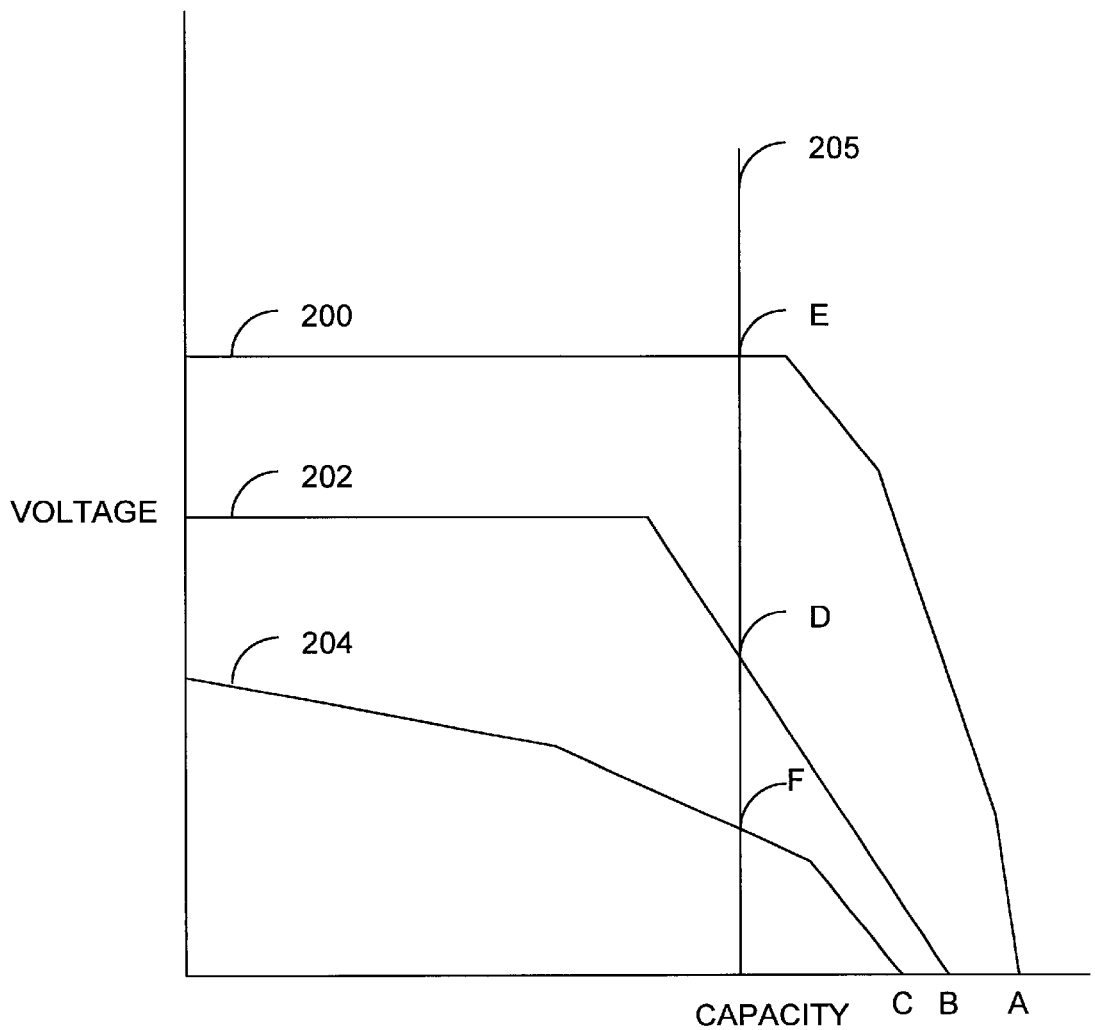
FIG. 2 is a graphical representation of a method of indexing a capacity of interest to current battery operating conditions, such as voltage and rate of discharge, in accordance with the principles of the present invention.

Given a capacity of interest, the process proceeds to step 102, where alarm settings (also referred to herein as trip points, indices or flags) are determined for a variety of voltage and discharge rates, and, optionally, operating temperature of the battery. The indices map voltage, discharge-rate and temperature information to one or more capacities of interest. As illustrated by the graph of FIG. 2 which plots voltage versus capacity for a variety of battery discharge rates, the total capacity of a battery varies according to the discharge rate of the battery. Curves 200, 202, and 204 respectively represent low, medium and high discharge rates. If the medium discharge rate represented by the curve 202 is the discharge rate of an operation of interest and the capacity of interest is given by point A, other voltage/discharge-rate pairs may be indexed to the capacity of interest.

That is, as illustrated by the respective intersections A, B, and C of curves 200, 202, and 204 with the horizontal, capacity, axis, the remaining useful capacity associated with the high level discharge rate is less than that for the medium discharge rate, which, in turn, is less than that for the low level discharge rate. If the capacity of interest is given by the point D on the curve 202, voltages on the other discharge curves may be indexed to this point by, effectively, drawing a line 205 parallel to the vertical axis that passes through the point D and recognizing that the capacity level associated with every other discharge curve that intersects this vertical line is the capacity at each discharge rate that corresponds to the capacity of interest (given by point D). For a given discharge rate, the voltage at the point of intersection (points E and F, for example) with the vertical line 205 provides an indication that, although the remaining useful battery capacity at the current discharge rate may be greater or less than the capacity of interest, should operations switch to the discharge rate of interest, the battery retains the useful capacity of interest. Consequently, determining these intersection points (empirically, using battery chemistry models, through computations, or by combining these methods) and indexing the voltage/discharge rate values to the capacity of interest allows a battery monitor system in accordance with the principles of the present invention to recognize when the remaining capacity of a battery reaches a capacity of interest, even if the current discharge rate is not the discharge rate of interest. For more accurate execution, the temperature of the battery may also be considered and used to adjust the indices. Additionally, the indices needn't be single-point discharge-rate/voltage pairs, but may encompass ranges of voltage and discharge rate values about the intersection point.

Returning to the flow chart of FIG. 1, after indexing one or more discharge rates to the one or more battery capacities of interest in step 102, the process proceeds to step 104 where the indices are provided to a battery monitor in accordance with the principles of the present invention. The indices may be downloaded to the battery monitor from a host system through a communications port, they may be in the form of look-up tables stored within a battery monitor controller, or they may be stored in the form of routines that compute the indices within the battery monitor, for example.

From step 104 the process proceeds to step 106 where the battery monitor determines the current operating discharge rate of the battery, the current voltage of the battery, and, optionally, the temperature of the battery. A compact battery monitor system may be housed with the battery cells being monitored in a battery pack. Such a packaging arrangement generally ensures that the most accurate temperature, discharge rate, and voltage measurements can be made by the monitoring system. From step 106 the process proceeds to step 108, where the battery monitor compares the current measurements (voltage, discharge rate, and, optionally, temperature) to the indexed values and, if the current rates are not equal to (or in a neighborhood of) the indexed values, the process returns to step 106. The monitor may loop back to step 106 continuously until an index value is encountered, or the monitor may be driven by periodic interrupts to perform such comparisons. If the monitor determines in step 108 that indexed values have been reached, the monitor activates an alarm in step 110. In response to the alarm, an electronic device that employs the battery, such as a laptop or handheld computer, a personal digital assistant, or cellular telephone, may then execute the operation of interest for which the index was set. As for the battery monitor, after activating the alarm in step 110, the process proceeds to end in step 112. Although the process described in the discussion related to the flow chart of FIG. 1 involved a monitor that activates an alarm in response to the detection of a single index value, as previously described, a monitor system in accordance with the principles of the present invention may respond to a plurality of capacities of interest. Such an embodiment may employ an initial alarm that is responsive to a battery's attainment of one capacity of interest and subsequent alarms that each cause the monitor to activate alarms which a battery-operated device might respond to in a different fashion.

The temperature dependence of batteries, and the effect upon index values discussed in relation to the description of FIG. 1 may be addressed through use of a look up table such as that of FIG. 3. Each column represents a different temperature range, such as less than ten degrees below zero, less than zero, etc. Each row represents a discharge rate, such as twenty percent of capacity per hour (0.2C), fifty percent of capacity per hour (0.5C), etc. A voltage within each cell of the lookup table indicates the index value of voltage associated with the temperature and discharge rates corresponding to the column and row, respectively. That is, at temperatures below negative ten degrees and at a discharge rate of less than 0.2C, the index value for activating an alarm is voltage V1, for example. Each voltage, such as voltage V1, may be implemented as a voltage range. When this combination of voltage, discharge rate, and temperature is detected by a battery monitor in accordance with the principles of the present invention, the monitor activates an alarm. The alarm permits an associated electronic device to perform an operation of interest, possibly at a different discharge rate, before the battery capacity at that discharge rate is depleted.

Figure 4:
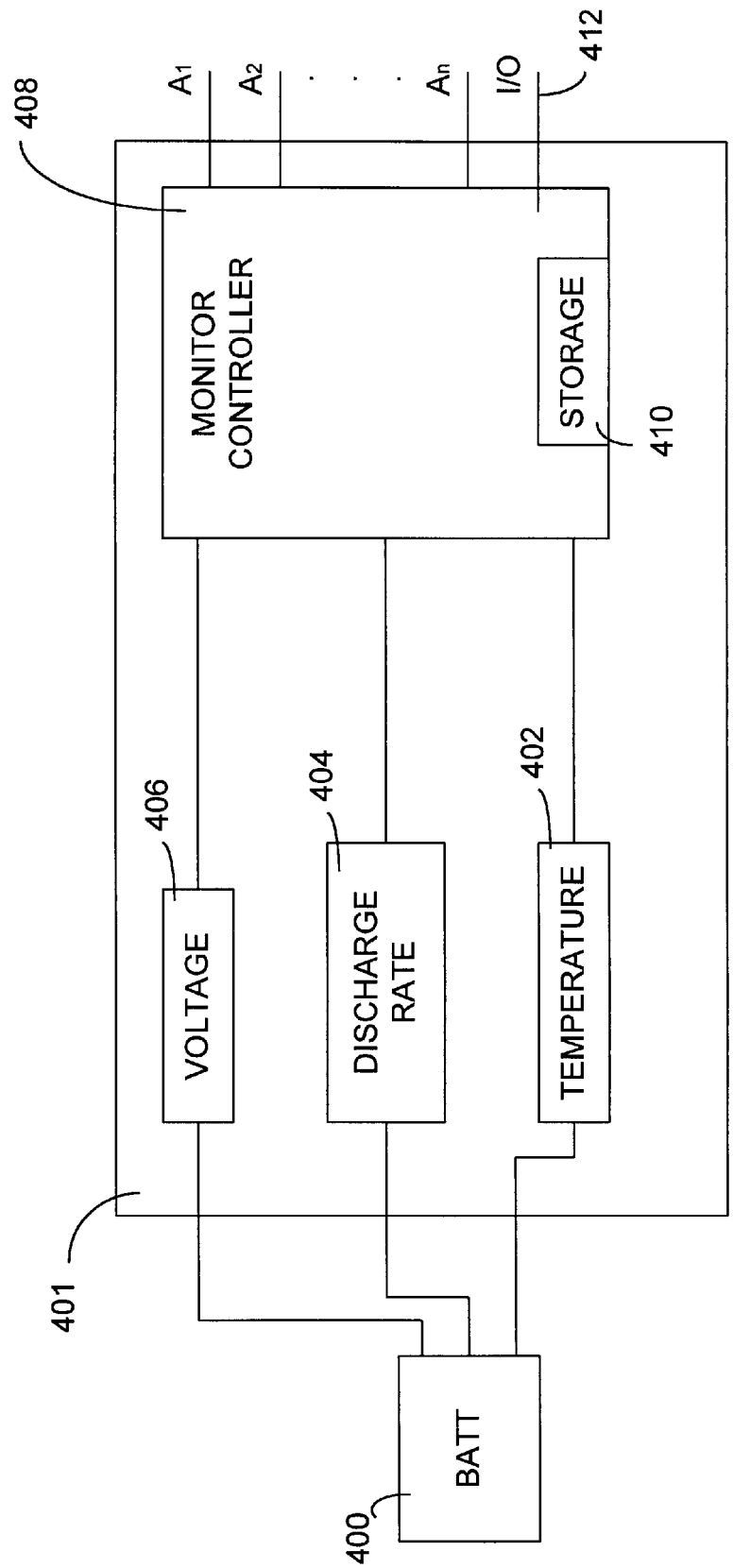
FIG. 4 is a conceptual block diagram of a battery monitoring system in accordance with the principles of the present invention.

The functional block diagram of FIG. 4 illustrates the major components of a battery monitoring system 401 in accordance with the principles of the present invention. Although the battery 400 is not itself a part of the monitoring system, in this illustrative embodiment the battery monitor is mechanically housed within a pack that includes the battery itself. One advantage to such a mechanical arrangement is that sensors, particularly the temperature sensor 402, may more accurately reflect the current condition of the battery 400 itself. The temperature sensor 402 may take the form of a thermistor, for example. A shunt resistor may be used for the discharge rate sensor 404, and any of a variety of circuitry and voltage reference combinations, including analog to digital converters, may be used for the voltage sensor 406. The battery 400 may be primary or secondary, and may employ any chemistry, including Lithium Ion, Nickel Cadmium, Lead acid, etc. As mentioned in the discussion related to FIG. 1, both the particular battery being monitored and the capacity of interest may be characterized before use of the battery. Indexes for a plurality of voltage, discharge rate, and temperatures may then be stored within the monitor system in a storage medium 410, and/or downloaded to the monitor controller 408 on a regular basis through an input/output port 412. The battery monitor controller 408 may be implemented in a variety of technologies, including a core controller within an applications specific integrated circuit, a stand-alone microcontroller, or a combination of sequential and combinatorial logic. In operation, the battery monitor controller 408 employs the sensors 402, 404, and 406 to monitor the battery 400 and, as described in greater detail in the discussion related to the flow chart of FIG. 1, whenever an index is encountered the battery monitor controller 408 activates an alarm A1, A2 . . . An.

Figure 5:
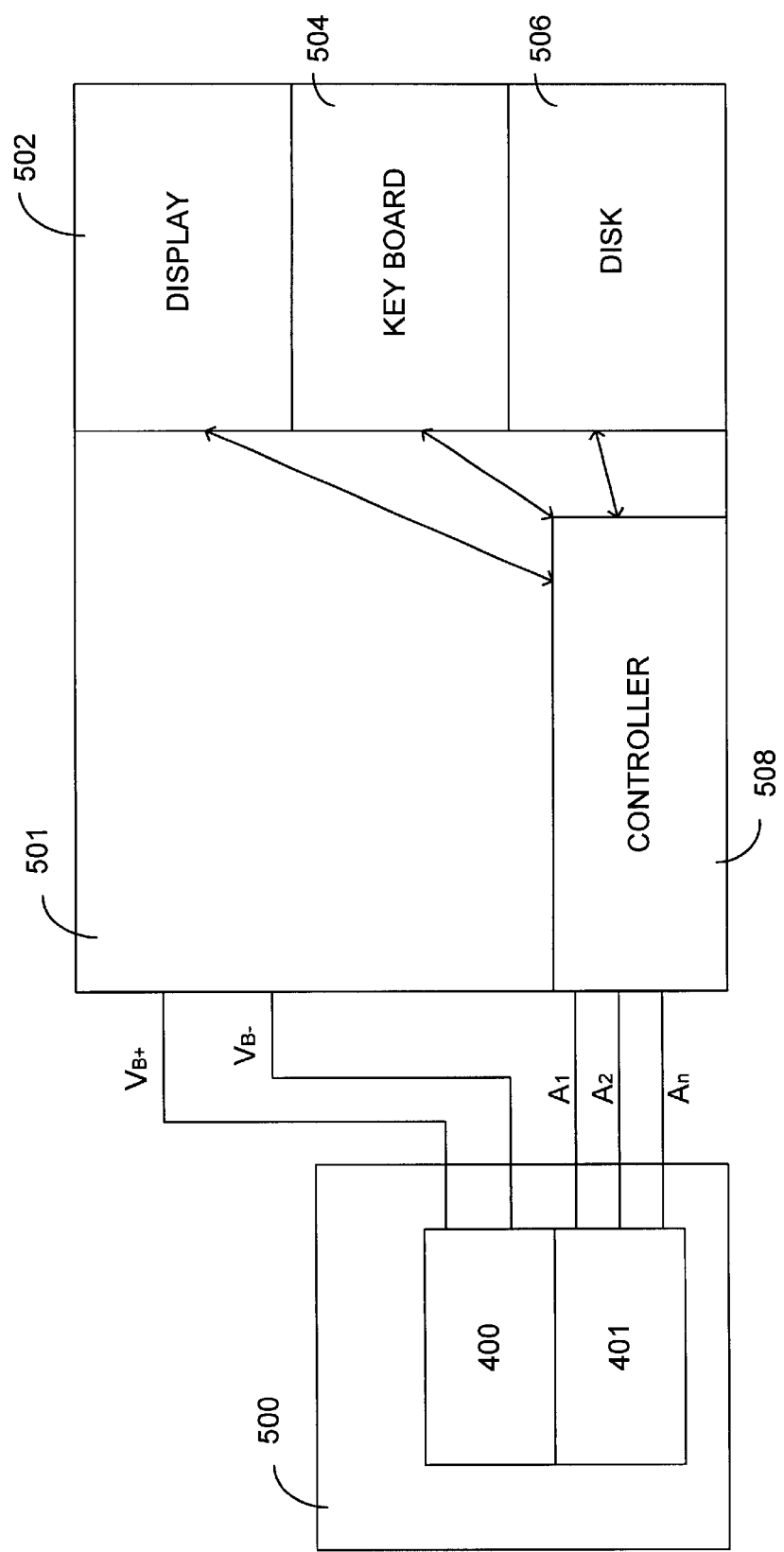
FIG. 5 is a conceptual block diagram of an electronic system, which incorporates a battery monitor system in accordance with the principles of the present invention.

In the conceptual block diagram of FIG. 5 a battery-powered electronic device, such as a laptop computer, hand-held computer, personal digital assistant, or cellular telephone, employs a battery 400 and battery monitor 401 as previously described. In this illustrative embodiment, the battery 400 and battery monitor 401 are depicted as a unit to reflect their likely physical proximity in a battery pack 500. The battery pack 500 provides battery power in the form of power VB+ and return VB– to the consuming electronics 501, which may include a display 502, keyboard 504, a disk drive 506, and an electronic system controller 508. The battery pack 500 also provides one or more alarm outputs A1, A2, . . . , An, to the electronic system controller 508. The alarms are developed and used as described in the discussion related to the flow chart of FIG. 1.

A software implementation of the above described embodiment(s) may comprise a series of computer instructions either fixed on a tangible medium, such as a computer readable media, e.g. diskette, CD-ROM, ROM, or fixed disk, or transmittable to a computer system, via a modem or other interface device, such as communications adapter connected to the network over a medium. The medium can be either a tangible medium, including but not limited to, optical or analog communications lines, or may be implemented with wireless techniques, including but not limited to microwave, infrared or other transmission techniques. The series of computer instructions embodies all or part of the functionality previously described herein with respect to the invention. Those skilled in the art will appreciate that such computer instructions can be written in a number of programming languages for use with many computer architectures or operating systems. Further, such instructions may be stored using any memory technology, present or future, including, but not limited to, semiconductor, magnetic, optical or other memory devices, or transmitted using any communications technology, present or future, including but not limited to optical, infrared, microwave, or other transmission technologies. It is contemplated that such a computer program product may be distributed as a removable media with accompanying printed or electronic documentation, e.g., shrink wrapped software, preloaded with a computer system, e.g., on system ROM or fixed disc, or distributed from a server or electronic bulletin board over a network, e.g., the Internet or World Wide Web.

Although various exemplary embodiments of the invention have been disclosed, it will be apparent to those skilled in the art that various changes and modifications can be made which will achieve some of the advantages of the invention without departing from the spirit and scope of the invention. It will be evident to those reasonably skilled in the art that other components performing the same functions may be suitably substituted. Further, the methods of the invention may be achieved in either all software implementations, using the appropriate object or processor instructions, or in hybrid implementations that utilize a combination of hardware logic, software logic and/or firmware to achieve the same results. Processes illustrated through the use of flow charts may not be strictly linear processes and alternative flows may be implemented within the scope of the invention. The specific configuration of logic and/or instructions utilized to achieve a particular function, as well as other modifications to the inventive concept are intended to be covered by the appended claims.

The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. An apparatus comprising:
    a battery discharge rate indicator constructed and arranged to be connected to a battery to provide an indication of the battery's discharge rate;
    a battery voltage indicator constructed and arranged to be connected to the battery to provide an indication of the battery's voltage;
    a battery temperature indicator constructed and arranged to be connected to the battery to provide an indication of the battery's temperature; and
    a battery monitor controller configured to compare the battery voltage indicated by the battery voltage indicator, the discharge rate indicated by the battery discharge rate indicator and the temperature indicated by the battery temperature indicator, to one or more predetermined voltage/discharge-rate/temperature indices indicative of one or more battery capacities of interest and to determine that a battery index condition is met whenever the battery voltage, discharge rate and temperature are of values indicated by respective ones of said indices.

2. The apparatus of claim 1 wherein each of said one or more battery capacities of interest is the useful battery capacity at the discharge rate required for a corresponding operation of interest.

3. The apparatus of claim 1 wherein the battery monitor controller is further configured to provide an indication that the index condition is met.

4. The apparatus of claim 1, further comprising a port configured to receive battery capacity of interest index values.

5. The apparatus of claim 4 further comprising a storage medium configured to store battery capacity of interest index values.

6. The apparatus of claim 1 wherein each battery capacity of interest is related to one type of battery.

7. The apparatus of claim 6 wherein pluralities of battery capacities of interest are related to a plurality of battery types.

8. The apparatus of claim 1 wherein the battery capacity of interest is the capacity required to perform a shutdown operation in an electronic device.

9. The apparatus of claim 8 wherein the capacity required to perform a shutdown operation includes the capacity for a save to disk operation.

10. A battery-operated electronic apparatus comprising:
   a battery;
   a battery discharge rate indicator connected to measure the battery discharge rate;
   a battery voltage indicator connected to measure the battery voltage;
   a battery temperature indicator connected to measure the battery temperature; and
   the a battery monitor controller configured to compare the discharge rate indicated by the discharge rate indicator, the battery voltage indicated by the battery voltage indicator and the battery temperature indicated by the battery temperature indicator to one or more predetermined discharge-rate/voltage/temperature indices indicative of one or more battery capacities of interest and to determine that a battery index condition is met whenever the battery discharge rate, voltage and temperature are of values indicated by respective ones of an index.

11. The battery-operated electronic apparatus of claim 10 wherein said one or more battery capacities of interest is the useful battery capacity at the discharge rate required for a corresponding operation of interest.

12. The apparatus of claim 11 wherein the battery capacity of interest is the capacity required to perform a shutdown operation in an electronic device.

13. The apparatus of claim 12 wherein the capacity required to perform a shutdown operation includes the capacity for a save-to-disk operation.

14. The apparatus of claim 10 further comprising a storage medium configured to store battery capacity of interest index values.

15. A method for monitoring battery conditions, comprising the steps of:
   (A) indexing battery voltages and discharge rates to one or more battery capacities of interests, wherein the one or more battery capacities of interest is the useful battery capacity at the battery discharge rate required for an operation of interest;
   (B) determining the current voltage and discharge rate of the battery;
   (C) comparing the voltage and discharge rate of the battery determined in step B to one or more indices;
   (D) activating an indicator whenever the comparison of step C indicates that said capacity of interest has been reached;
   (E) indexing battery temperatures to one or more battery capacities of interest;
   (F) determining the current temperature of the battery;
   (G) comparing the current temperature, voltage, and discharge rate determined in steps B and F to one or more indices; and
   (H) activating an indicator whenever the comparison of step G indicates that said capacity of interest has been reached.

16. The method of claim 15 further comprising the step of:
   (I) performing a shutdown operation in an electronics device in response to the setting of an indicator in step (H).

17. The method of claim 16 further comprising the step of:
   (J) downloading voltage, discharge rate, and temperature indices related to one or more battery capacities of interest to a battery monitor.

18. A method in a battery-operated electronic device comprising the steps of:
   (A) indexing battery voltages temperatures and discharge rates to one or more battery capacities of interest, wherein the one or more battery capacities of interest are the useful battery capacities at the battery discharge rates required for one or more corresponding operations of interest in the battery-operated electronic device;
   (B) determining the current voltage, temperature, and discharge rates of the battery;
   (C) comparing the voltage, temperature and discharge rate of the battery determined in step (B) to one or more indexes of step (A); and
   (D) activating an indicator whenever the comparison of step (C) indicates that a capacity of interest has been reached
   (E) downloading voltage, discharge rate, and temperature indices related to one or more battery capacities of interest to a battery monitor used in the electronic device.

19. The method of claim 18 further comprising the step of:
   (F) performing a shutdown operation in an electronics device in response to the setting of an indicator in step (D).

20. The method of claim 18 further comprising the step of:
   (G) storing the indices of step (E) in the battery monitor.

21. The method of claim 20 further comprising the step of:
   (H) the battery operated electronic device performing a shutdown operation in response to the setting of an indicator in step (D).

22. The method of claim 21 wherein the step (H) of performing a shutdown operation includes a save-to-disk operation.

* * * * *

UNITED STATES PATENT AND TRADEMARK OFFICE
CERTIFICATE OF CORRECTION

PATENT NO. : 6,677,860 B2
DATED : January 13, 2004
INVENTOR(S) : Richard J. DelRossi et al.

It is certified that error appears in the above-identified patent and that said Letters Patent is hereby corrected as shown below:

<u>Title page,</u>
Item [73], Assignee, the city and state for the Assignee should be -- Chandler, AZ (US) --

Signed and Sealed this

Thirtieth Day of March, 2004

JON W. DUDAS
*Acting Director of the United States Patent and Trademark Office*